United States Patent [19]
Ranganathan

[11] Patent Number: 6,101,620
[45] Date of Patent: Aug. 8, 2000

[54] TESTABLE INTERLEAVED DUAL-DRAM ARCHITECTURE FOR A VIDEO MEMORY CONTROLLER WITH SPLIT INTERNAL/EXTERNAL MEMORY

[75] Inventor: Ravi Ranganathan, Cupertino, Calif.

[73] Assignee: NeoMagic Corp., Santa Clara, Calif.

[21] Appl. No.: 08/896,970

[22] Filed: Jul. 18, 1997

Related U.S. Application Data

[62] Division of application No. 08/423,780, Apr. 18, 1995, abandoned.

[51] Int. Cl.[7] .................................................. G11C 29/00
[52] U.S. Cl. .......................... 714/718; 345/507; 345/519
[58] Field of Search ................... 371/21.1, 21.3, 371/27.1, 27.2; 345/519, 203, 508, 518, 507; 714/718

[56] References Cited

U.S. PATENT DOCUMENTS

| | | | |
|---|---|---|---|
| 5,138,619 | 8/1992 | Fasang et al. | 714/719 |
| 5,410,547 | 4/1995 | Drain | 324/73.1 |
| 5,442,642 | 8/1995 | Ingalls et al. | 714/718 |

*Primary Examiner*—Albert De Cady
*Assistant Examiner*—Shelly A Chase
*Attorney, Agent, or Firm*—Stuart T. Auvinen

[57] ABSTRACT

A video sub-system features reduced power consumption by integrating a video memory onto the same chip as the video memory controller. The video memory is preferably a small DRAM sufficiently large to store all pixel data for lower resolutions, but insufficient for higher resolutions. At higher resolutions, an external DRAM supplements the internal DRAM. The amount of external DRAM needed depends upon the resolution to be supported. The internal DRAM has a wide data bus and thus high bandwidth, since no external I/O pins are needed. The external DRAM is narrow to minimize pincount and power consumption. Since the external DRAM is slower and lower in bandwidth, pixel data from both internal and external DRAMs are interleaved together for each horizontal scan line. Thus the lower bandwidth of the external DRAM is masked by the high bandwidth of the wide internal DRAM. Either the internal or the external DRAM, or both, are automatically tested with a pseudo-random number generator that writes pseudo-random numbers to the DRAM while simultaneously supplying pixel data to the graphics data path for display. A checksum of the pixel data output from the graphics data path is generated for the first screen of pixels or frame, while on the second frame the pseudo-random number generator is disabled and the DRAM supplies the same pixel data that was written to it by the pseudo-random number generator during the first frame. The checksums for the first and second frames should match if the DRAM is free of faults.

5 Claims, 5 Drawing Sheets

TESTABLE INTERLEAVED DUAL-DRAM ARCHITECTURE FOR A VIDEO MEMORY CONTROLLER WITH SPLIT INTERNAL/ EXTERNAL MEMORY

RELATED APPLICATION

This Application is a divisional of Ser. No. 08/423,780 filed Apr. 18, 1995, now abandoned.

BACKGROUND OF THE INVENTION—FIELD OF THE INVENTION

This invention relates to video display systems, and more particularly to video memory architectures.

BACKGROUND OF THE INVENTION— DESCRIPTION OF THE RELATED ART

Display systems are a vital part of most personal computer systems. Graphic displays provide flexibility in sending information to the computer user and may increase the ease-of-use of the computer. However, compatibility with existing software requires that many resolutions be supported by any commercial video controller that is video-graphics adapter (VGA) compatible. For example, standard VGA specified a resolution of 640×480, meaning that each of the 480 horizontal lines has 640 pixels. Each screen thus requires 640×480=307,200 pixels.

Common higher resolutions, sometimes referred to as super-VGA (SVGA), XGA, and 1280-mode require 800× 600, 1024×768, and 1280×1024 pixels. SVGA, XGA, and 1280-mode screens have a total of 480,000, 768,432 and 1,310,720 pixels, which is up to 4.3 times as many pixels as standard VGA.

Because the pixels are stored in a video memory, support of 1024 XGA will require 2.5 times as much video memory as VGA, while 1280 mode support will require 4.3 times the video memory of standard VGA. Thus larger memories are called for at higher resolutions.

Higher resolutions demand not only larger video memories, but also that more pixels be transferred from the video memory to the screen. If the overall refresh rate of the screen is to remain relatively constant, then more pixels must be transferred during a given period of time. Thus a higher bandwidth from the video memory is needed for higher resolutions.

While video memories have improved somewhat in access time, the memory chips themselves, often dynamic random-access memory (DRAM) or dual-ported DRAM known as video RAM (VRAM), have not improved as quickly as the resolutions require. DRAM speeds have increased from 100 nanoseconds (ns) to 60 ns, but bandwidth requirements have increased by a factor of 4.3, as noted above. The bandwidth is usually met by increasing the width of the video memory. By using 32-bit-wide DRAM, bandwidth can be doubled over 16-bit-wide DRAM. XGA or 1280-mode often require 64 or 128-bit-wide DRAM. These wider video memories can be easily constructed from multiple 1-, 4-, or 8-bit-wide DRAM chips.

Wide Video Memory Increases Pincount and Power Consumption

A drawback of these wider video memories is the larger number of pins needed to interface the video memory controller with the DRAM chips. If the data must be brought onto the video controller chip, then 128 data pins would be needed if 128-bit-wide video memory is used. Additionally, many RAS and CAS pins are needed to strobe the DRAM chips, and other control signals such as write-enables and buffer controls may be needed too. Since the DRAM chips are available only in certain discrete depths and widths, wider memory may require much more actual memory than what is needed. For example, if the shallowest-size DRAM chip is 256K×4 bits, then 128-bit wide memory would have to be a minimum of 256K×128 bits, or 4 Mega Bytes, which is much larger than the 1 MegaByte or so required.

While desktop personal computers (PC's) may be able to use video controllers with high pincount, the power required to drive 128 or more additional pins would strain the batteries of portable systems. Additionally, the larger package needed for a higher-pin-count video controller may necessitate a larger casing to house the portable system. As portable systems shrink in size, large pin-count packages become more of a problem for the system designer.

Current technology allows a small DRAM to be integrated onto the same silicon die as the video controller. This eliminates the pincount problem as additional pins are no longer needed to transfer pixel data to external DRAM. However, the technology limits the amount of DRAM that may be integrated onto the video controller die. While lower resolutions may be supported by the on-chip DRAM, higher resolutions require more DRAM than can economically fit on the die.

Testability

Testing a DRAM integrated onto a video controller is problematic. Normally each memory location is written to, then read and verified. However, the input controls for the DRAM may not be accessible as pins on the video controller chip. The data outputs are also not available, as the DRAM data is sent to an internal FIFO buffer and then transferred to additional on-chip logic to process data before passing the data to the display screen. An additional problem is that a very large number of test vectors must be written to test the entire DRAM. There may be too many test vectors for a standard logic-chip tester.

What is desired is a video display sub-system with a combination of on-chip and off-chip DRAM to support high resolutions. It is desired to interleave pixels from a narrow external DRAM with pixels from a wide internal DRAM. The interleaving must support the high bandwidth required by higher resolutions. The internal DRAM must be easily tested.

SUMMARY OF THE INVENTION

A video sub-system reduces power consumption by integrating a video memory onto the same chip as the video memory controller. The video memory is preferably a small DRAM. The internal DRAM has a large width and thus high bandwidth, since no external I/O pins are needed. The external DRAM is narrow to minimize pincount and power consumption. Since the external DRAM lower in bandwidth, pixel data from both internal and external DRAMs are interleaved together for each horizontal scan line.

A method displays an image on a screen, where the image has a plurality of pixels arranged in a plurality of horizontal lines. Each horizontal line hasxpixels of data. An internal portion of a video memory transfers n pixels of data during a first portion of a horizontal scan time period. An external portion of the video memory transfers m pixels of data during another portion of the horizontal scan time period. These two steps are repeated until allxpixels of data in the horizontal line are transferred to the screen. Then These steps are repeated for all horizontal lines in the screen. Thus the image is displayed on the screen with pixels from the internal and the external portion of a video memory.

In other aspects the invention is a video sub-system for displaying an image on a screen. A video memory means stores pixels of display information for a whole screen and has an internal portion and an external portion. The internal portion is on a first silicon substrate, but the external portion not on the first silicon substrate. A memory controller means is on the first silicon substrate and responds to a memory clock. It controls the transfer of the pixels of display information to and from the internal portion and the external portion of the video memory means. A display means receives the pixels of display information from the video memory means, and displays an image comprised of the pixels of display information.

In still further aspects of the invention the internal portion of the video memory means transfers n pixels of display information during each read cycle, while the external portion of the video memory means transfers m pixels of display information during each read cycle. The value of n is larger than m. The image on the screen is comprised of a plurality of horizontal lines, with each horizontal having× pixels of display information. Both n and m are each less than x. Each horizontal is composed of an alternating sequence of n pixels of display information from the internal portion of the video memory means and m pixels of display information from the external portion of the video memory means.

In other aspects the DRAM is automatically tested with a pseudo-random number generator that writes pseudo-random numbers to the DRAM while simultaneously supplying pixel data to the graphics data path for display. A checksum of the pixel data output from the graphics data path is generated for the first screen of pixels or frame, while on the second frame the pseudo-random number generator is disabled and the DRAM supplies the same pixel data that was written to it by the pseudo-random number generator during the first frame. The checksums for the first and second frames should match if the DRAM is free of faults.

A method of testing a video memory controller includes the steps of:
(a) generating a sequence of binary patterns for use as a test input source during a first frame;
(b) writing each binary number in the sequence of binary patterns to a video memory while also writing each binary number to a video buffer;
(c) manipulating each binary number in the sequence of binary patterns with a graphics data path;
(d) outputting pixel data from the graphics data path, the pixel data in a format for visual representation by a display;
(e) generating a checksum from the pixel data output from the graphics data path;
(f) storing the checksum as a first checksum after a first frame of pixel data has been output by the graphics data path;
(g) reading a sequence of binary patterns from the video memory during a second frame, the sequence of binary patterns being the same sequence of binary patterns written to the video memory during the first frame;
(h) repeating steps (c) through (e) for all pixel data in the second frame, the checksum being generated during the second frame being a second checksum;
(i) comparing the second checksum generated during the second frame to the first checksum stored after the first frame, and signaling a DRAM fault if the first checksum mismatches the second checksum.

In other aspects the sequence of binary patterns is a walking ones pattern, a walking zeros pattern, a checkerboard pattern or a counter pattern. The sequence of binary patterns may also be generated by a pseudo-random number generator

DETAILED DESCRIPTION

The present invention relates to an improvement in memory architectures for video controllers. The following description is presented to enable one of ordinary skill in the art to make and use the invention as provided in the context of a particular application and its requirements. Various modifications to the preferred embodiment will be apparent to those with skill in the art, and the general principles defamed herein may be applied to other embodiments. Therefore, the present invention is not intended to be limited to the particular embodiments shown and described, but is to be accorded the widest scope consistent with the principles and novel features herein disclosed.

Figure 1:
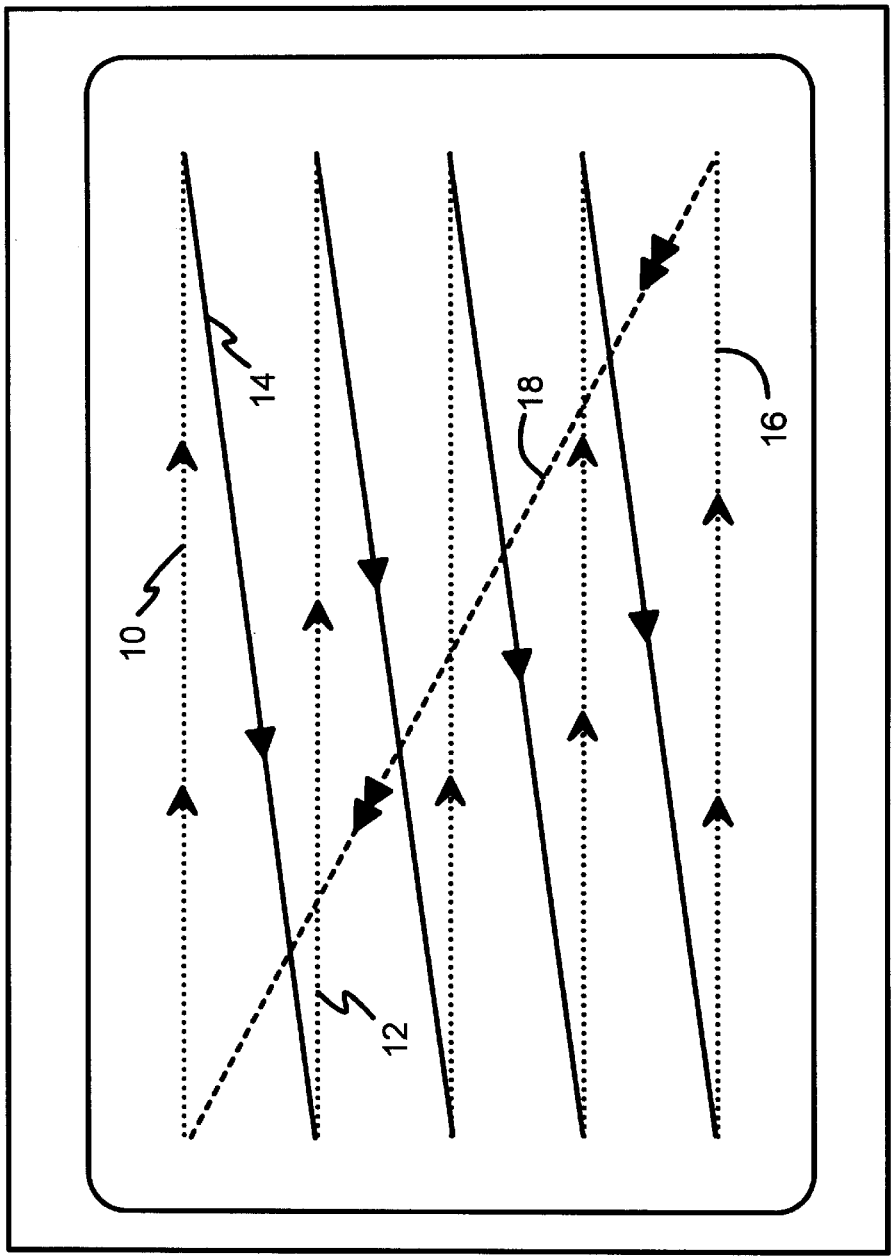
FIG. 1 is a diagram of a cathode-ray-tube (CRT) video display.

FIG. 1 is a diagram of a display, which could be a cathode-ray-tube (CRT) video display, or a flat-panel liquid-crystal display (LCD) or other type of display. An image is formed on the display screen by selectively energizing or illuminating small dots or pixels on the screen. In a CRT, a pixel is energized by an electron gun that directs a beam of energizing electrons to a particular point on the screen. The electron beam is scanned from left to right in a horizontal line and pulsed to illuminate some points on the line but not others. The screen is divided into a number of horizontal lines 10, 12, 16, with each line comprising a number of pixels. The pixels in a line are illuminated one-by-one from the left side to the right side of a horizontal lines 10, 12, 16.

Once the entire horizontal line 10, 12, 16 has been scanned, the electron beam is disabled or "blanked" so that no pixels are energized and the electron beam is re-traced back to the beginning on the next horizontal line 12. This horizontal re-trace 14 follows a diagonal path. After re-trace, the blanking is ended and the next horizontal line 12 is scanned. The process of scanning a horizontal line and re-tracing is repeated until all lines are scanned. Once scanning of the last horizontal line 16 is complete, the electron beam is returned to the beginning of the first line 10 by a vertical re-trace 18. The electron beam is again blanked to prevent any illumination while the electron beam is being retraced to the top of the screen.

Other display technologies also divide a screen into horizontal lines comprised of pixels that are either illuminated or not. A horizontal recovery or blanking period between horizontal lines and a vertical recovery or blanking period to return to the top of the screen may also be necessary with these display technologies, even though an electron beam is not used.

Figure 2:
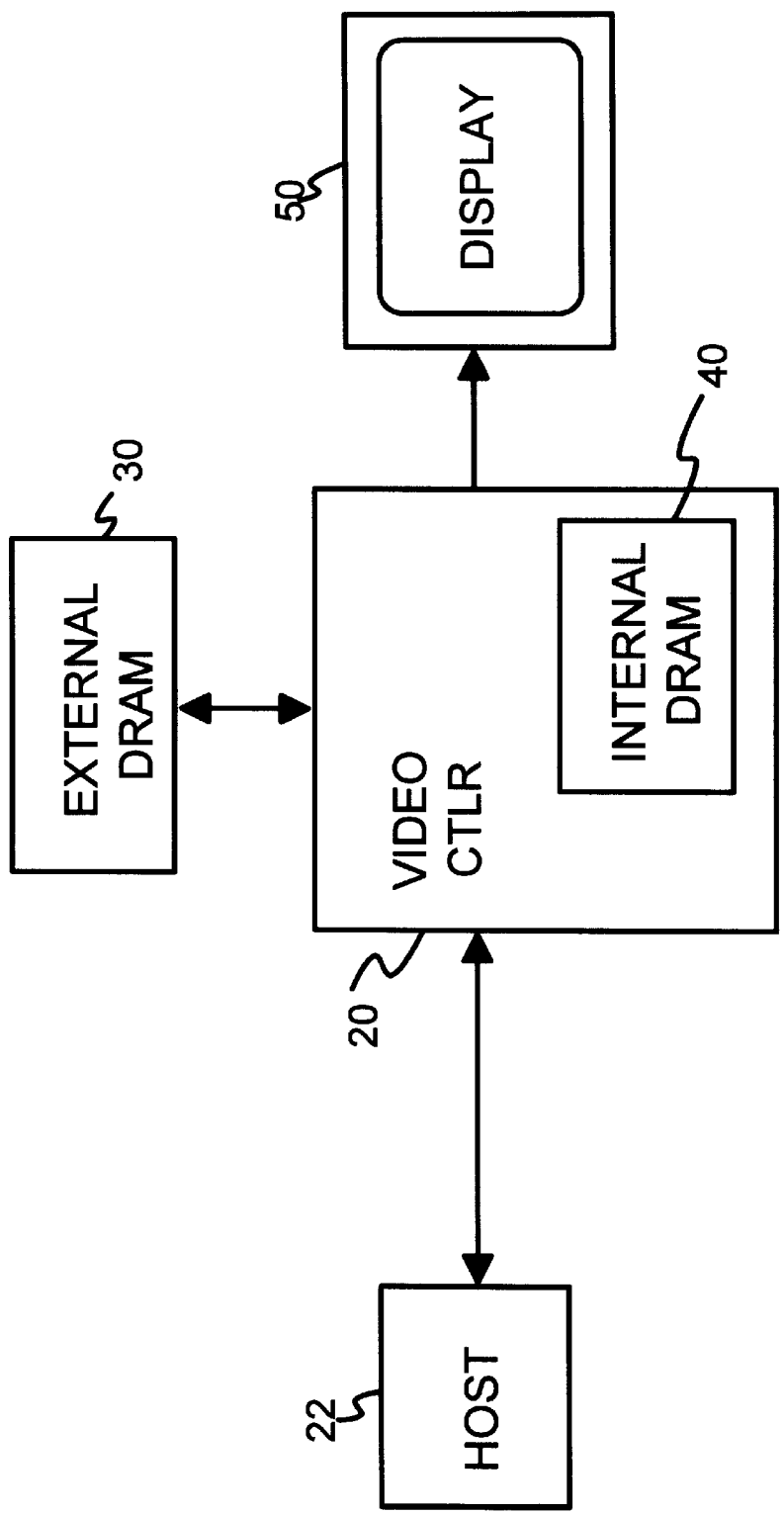
FIG. 2 is a diagram of a dual-DRAM video display subsystem.

FIG. 2 is a diagram of a dual-DRAM video display subsystem. Video controller chip 20 generates control signals, such as RAS and CAS, for an on-chip internal DRAM 40. For higher resolutions, the size of internal DRAM 40 is insufficient; thus external DRAM 30 is needed for higher resolutions. Video controller chip 20 also generates control signals for external DRAM 30. Either internal DRAM 40 alone, or both internal DRAM 40 and external DRAM 30, contain sufficient memory to hold data for all of the pixels to be displayed on display 50. Video controller chip 20 reads pixel data out of the video memory, either internal DRAM 40 or external DRAM 30. Video controller chip 20 then transfers pixel data to display 50.

Pixel data may be several bytes in size, to indicate the color of the pixel. FIFO buffers (not shown) may exist on video controller chip 20 to buffer the pixel data out to display 50. Conversions of the pixel data may also occur, such as a conversion from color to gray-scale for a LCD screen, or color mapping.

A host 22, such as an AT or PCI bus on a personal computer, writes video data to the video memory using video controller chip 20. This video data is normally in the form of pixel data that is merely written directly to either internal DRAM 40 or external DRAM 30. Host 22 is unaware that the video memory has been split into an internal and an external portion. Video controller chip 20 decodes the write request from host 22 and maps the pixel data to either external DRAM 30 or internal DRAM 40.

The same pixel data is not written to both internal DRAM 40 and external DRAM 30. Thus internal DRAM 40 is not merely a copy or a subset of a portion of the pixel data in external DRAM 30. The video memory is split between a portion in the internal DRAM 40, and possibly a second portion in the external DRAM 30. This is an efficient use of the memory resources since only a single copy of the pixel data is stored.

VIDEO MEMORY MULTIPLEXING—FIG. 3

Figure 3:
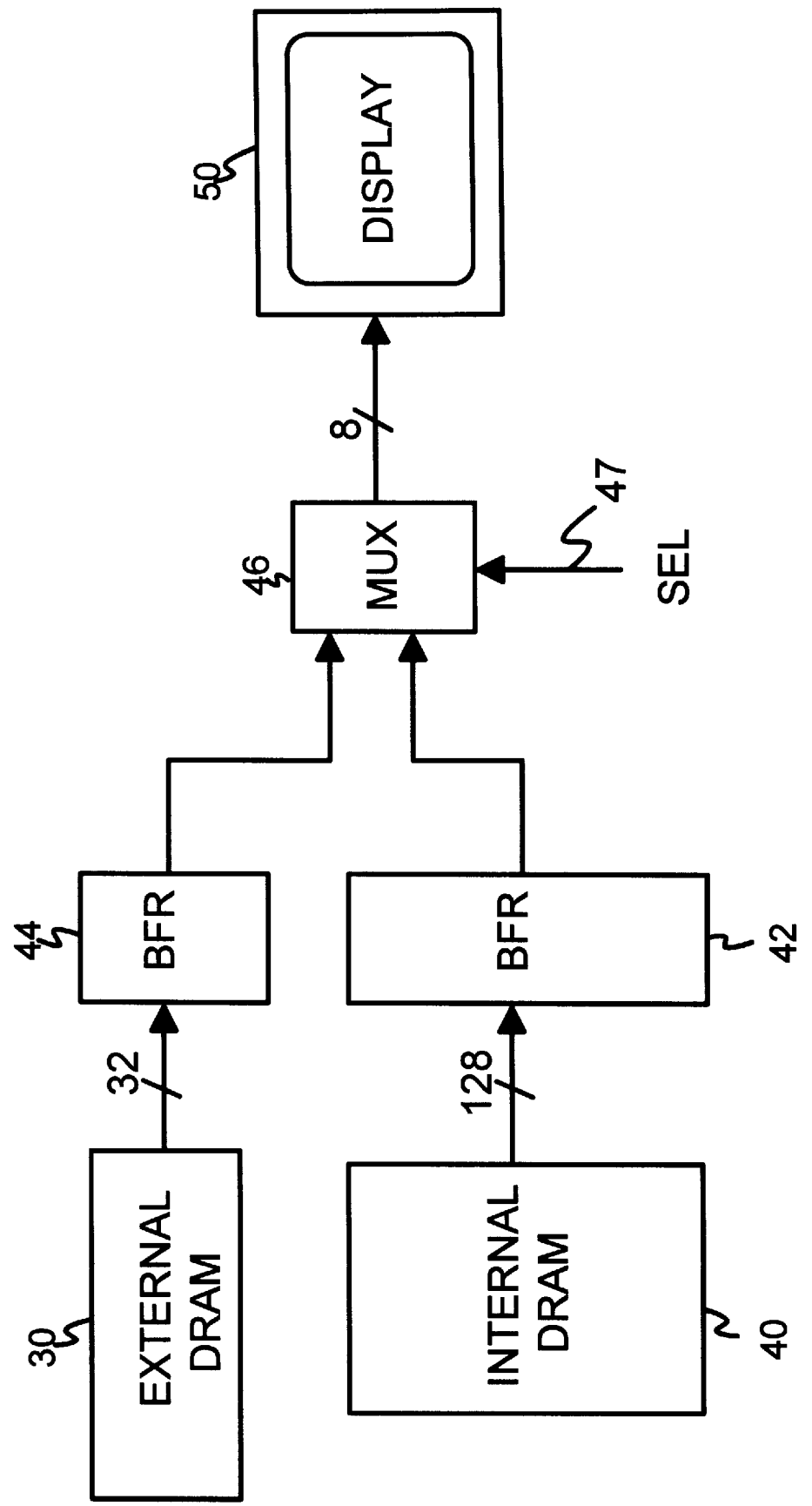
FIG. 3 shows the muxing and buffer of pixel data within a video controller chip.

FIG. 3 shows the muxing and buffer of pixel data within video controller chip 20. Since internal DRAM 40 does not use I/O pins on video controller chip 20, internal DRAM 40 may be made as wide as required to meet the bandwidth of pixel data to transfer to display 50. Internal DRAM 40 is preferably 128-bits wide, being able to transfer 128 bits of pixel data during each read. These 128 bits of pixel data are read out of internal DRAM 40 into buffer 42, which latches the 128 bits of pixel data, allowing internal DRAM 40 to start to read the next 128 bits of pixel data.

Each of the four 32-bit words of pixel data latched in buffer 42 is sent in succession to mux 46. When select 47 is set high ("internal"), then a 32-bit pixel word is sent to display 50, one 8-bit pixel at a time. If each pixel is represented by an 8-bit byte, then each 128-bit read from internal DRAM 40 contains 16 pixels.

When internal DRAM 40 lacks capacity to store an entire display screen of pixels, external DRAM 30 stores a portion of the pixel data for the display screen. I/O pins on video controller chip 20 are needed to control external DRAM 30, and to transfer the data from external DRAM 30. Since these I/O pins are a relatively expensive resource, and they consume power, the number of I/O pins is kept to a minimum. The pincount is kept down by using a smaller width for the data path. While internal DRAM 40 is 128-bits wide, external DRAM 30 is only 32-bits wide. Each read of external DRAM 30 transfers 32 bits of pixel data to buffer 44. Buffer 44 latches these 32 bits, allowing external DRAM 30 to start reading the next 32 bits of pixel data. These 32 bits of latched pixel data are transferred from buffer 44 to mux 46. Mux 46 receives these 32 bits of pixel data from external DRAM 30 when select 47 is low ("external"). The 32 bits are sent to display 50 one 8-bit pixel at a time. Thus each read of external DRAM 30 supplies 4 pixels.

Apportioning of Pixel Data between Internal and External DRAM

For low resolutions, internal DRAM 40 is sufficiently large to contain all the pixels for a display screen. Standard VGA requires 307,200 pixels. At one byte per pixel, a total of about 307 Kbytes are needed for a display screen. Thus a half-megabyte (512 Kbytes) of internal DRAM 40 is sufficient to hold all pixel data for standard VGA. External DRAM 30 is not needed for standard VGA.

However, for super VGA (SVGA), 768,432 pixels are needed. Since a 512 Kbyte internal DRAM 40 is too small for a whole display screen of pixels, some of the pixel data must be stored in external DRAM 30. The first 512,000 pixels may be stored in internal DRAM 40, while the remaining 256,000 pixels are stored in external DRAM 30. (Numbers are approximate)

If XGA is supported, then the first 512,000 pixels are stored in internal DRAM 40, while the remaining 788,000 pixels must be stored in external DRAM 30. While a 256K external DRAM would suffice for SVGA, almost a full megabyte of external DRAM is needed for XGA. Part of external DRAM 30 may be unused.

A larger color palette may increase the size of each pixel stored. While an 8-bit pixel has been described, 24-bit color may require 3 or 4 bytes for every pixel, tripling the DRAM required. Likewise a smaller color palette can decrease memory requirements.

INTERLEAVING OF PIXELS FROM INTERNAL AND EXTERNAL DRAMS

Figure 4:
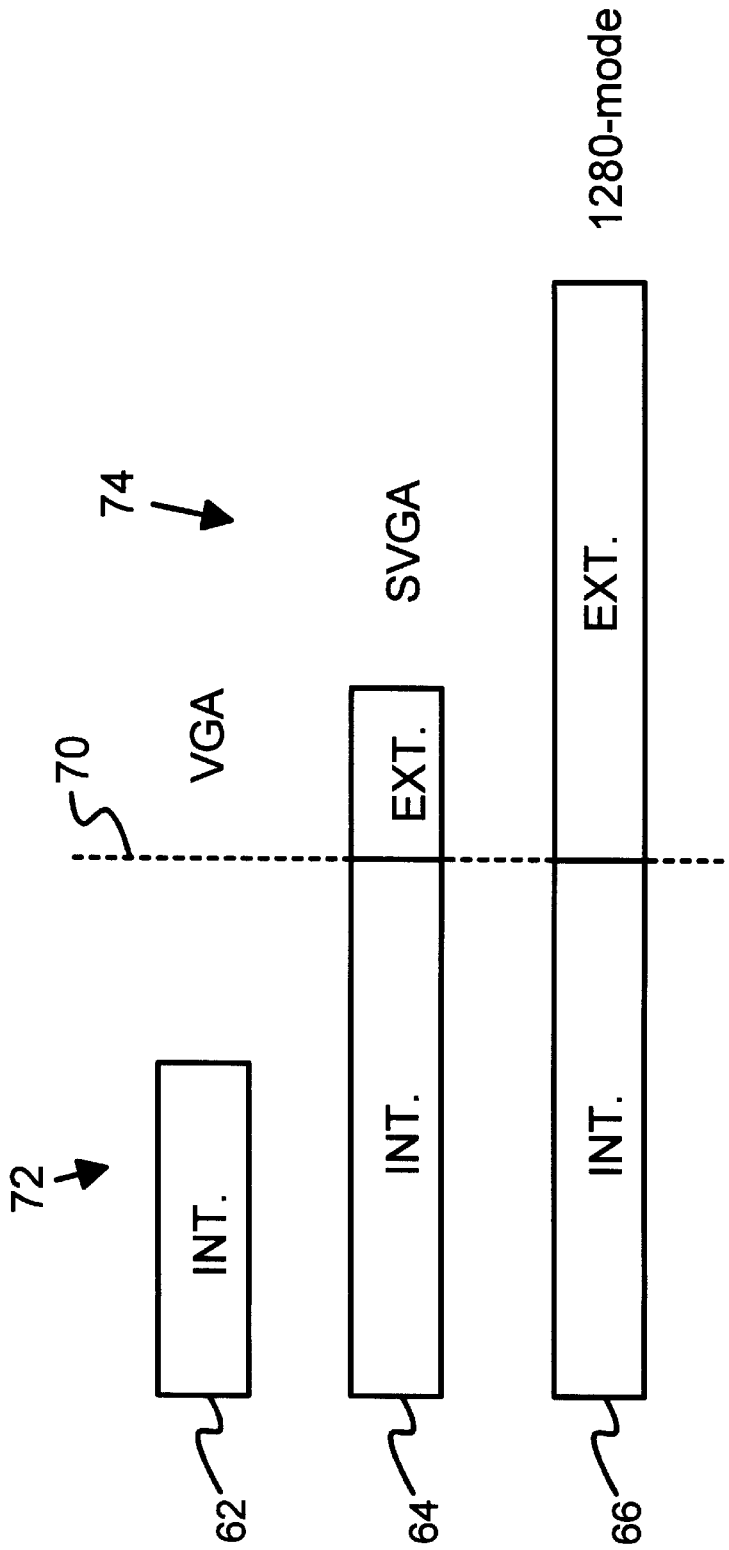
FIG. 4 shows a diagram for video memory usage for varying resolutions.

FIG. 4 shows a diagram for video memory usage for varying resolutions. The capacity of the internal DRAM divided by the total number of horizontal scan lines is shown by dashed line 70. A horizontal scan line 62 for VGA resolution may be made up of pixels entirely from internal DRAM. However, SVGA resolution horizontal scan line 64 requires more pixels than VGA scan line 62. The external DRAM as -well as the internal DRAM must be used to supply enough pixels for the longer SVGA scan line 64. This is indicated by a portion 72 of scan line 64 being from internal DRAM, and the remaining portion 74 being from external DRAM.

For XGA, even more pixels are needed for each XGA horizontal scan line 66. Thus the external portion 74 from external DRAM grows to supply the additional pixels for the higher resolution.

For simplicity, FIG. 4 has shown dashed line 70, the capacity of the internal DRAM divided by the number of scan line, as a constant. This would be true if all resolutions had the same number of scan lines. However, higher resolutions have more scan lines as well as more pixels per scan line. Dashed line 70 should tilt to the left for higher resolutions because the larger number of scan lines reduced the number of pixels available for each line from the internal DRAM. The internal portion 72 becomes smaller at higher resolutions because of the larger number of scan lines needed. Therefore at higher resolutions a larger relative portion of each scan line must come from the external DRAM.

Simple Interleaving

The simplest way to interleave pixel data from both the internal and external DRAMs would be to have each scan line be composed of pixels from either the internal or external DRAM. For SVGA (1024×768), where about two-thirds of the total pixels must come from the internal DRAM, the first 512 lines of the 768 lines will have all 1024 pixels from the internal DRAM, while the last 256 lines will each have all 1024 pixels/line from the external DRAM.

This simplest scheme is undesirable since the external DRAM will have a much lower bandwidth than the internal DRAM, both because of the narrower width and the slower access time of external DRAM chips. A better scheme is to have each line have pixels from both the internal and external DRAMs. This allows the horizontal refresh period between each line to be used to begin accessing the external DRAM, as well as the time when the internal DRAM is supplying pixels for that line.

Figure 5:
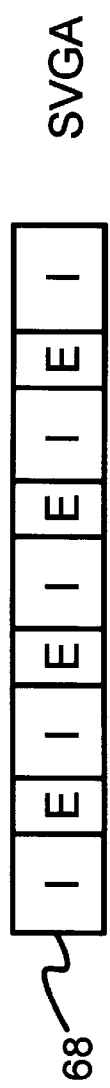
FIG. 5 shows a preferred embodiment of full interleaving of internal and external DRAM.

FIG. 5 shows a preferred embodiment of full interleaving of internal and external DRAM. Each horizontal scan line 68 has pixels from the internal DRAM and from the external DRAM interleaved. Pixels from the internal DRAM are labeled "I" while pixels from the external DRAM are labeled "E". This full interleaving is preferred because the external DRAM can begin access while the internal DRAM is supplying pixels.

TESTABILITY FEATURES

The integrated DRAM must be tested to ensure that all memory cells are functional. One approach is to write a large number of test vectors to write and read each memory cell, and add muxing logic so that the I/O of the DRAM block is presented to the pins of the video controller chip. However, a large number of test vectors must be written to have confidence that the test was thorough enough to catch all defects. The number of test vectors may be so great that ordinary logic-chip testers cannot test the video chip with an embedded DRAM. A more expensive memory tester might have to be used to test the DRAM, while a second logic tester is used to test the logic portions of the video memory controller chip.

The inventor has realized that the data path of a video controller can be used to test the DRAM block in an automated way. Thus the data I/O of the DRAM does not have to be presented to the outputs of the video controller chip. During a test mode, data from the DRAM will be sent to other logic in the video controller just as pixel data for the screen would. This graphics data-path logic will manipulate the DRAM data as it would for normal pixel data: the pixel data may be translated by a color palette RAMDAC, or other attributes may alter the pixel data. For LCD panels, a color-to-gray-scale conversion may also occur. The final pixel data sent to the panel is presented to the pins of the video controller chip, and this manipulated pixel data may easily be examined by a tester.

A pseudo-random number generator (PRNG) may be added as a source for test patterns. The PRNG supplies pseudo-random binary numbers for writing into the DRAM. Ideally, these numbers are written to the DRAM during a screen refresh when the DRAM would normally be read. The DRAM controller for screen refresh is used to supply timing and access to the DRAM, but the sense of the read/write control to the DRAM is inverted. Additional test sequencers or state machines are therefore not needed.

The PRNG data that is written into the DRAM during the screen refresh is also sent directly to the graphics data path logic for display by the screen. Thus the PRNG supplies data to both the DRAM and to the graphics data path. The PRNG can write data to the DRAM at the same time that it sends the data to the graphics data path. The PRNG not only supplies data to the graphics data path, but also supplies the same data for writing into the DRAM.

This dual use of the PRNG data has the surprising result that the same data may be sent down the graphics data path twice. The first time the PRNG supplies the data, while the second time the DRAM supplies the data. If the DRAM is defect-free, the first and second data will be the same. A comparison of the output of the data path can detect a defect in the DRAM, even if the data is modified by the graphics data path.

While a tester could observe each pixel output to the screen to test the DRAM, a checksum generator can be integrated onto the video controller chip to generate a checksum of the pixel data. The checksum value could then be read out of the video controller chip and compared to an expected value to detect memory errors.

The data output from the graphics data path will be changed in an identical way if the video mode, attributes, and color mapping is kept constant for the two data sets. Thus any data mismatch between the first data set from the PRNG and the second data set from the DRAM indicates that the DRAM did not store the PRNG data correctly. A simple comparison can be made between the first checksum generated during the first data set from the PRNG and the second checksum generated during the second data set from the DRAM. If the two checksums do not match, then a DRAM defect was found.

Apparatus for Video Memory Testing

Figure 6:
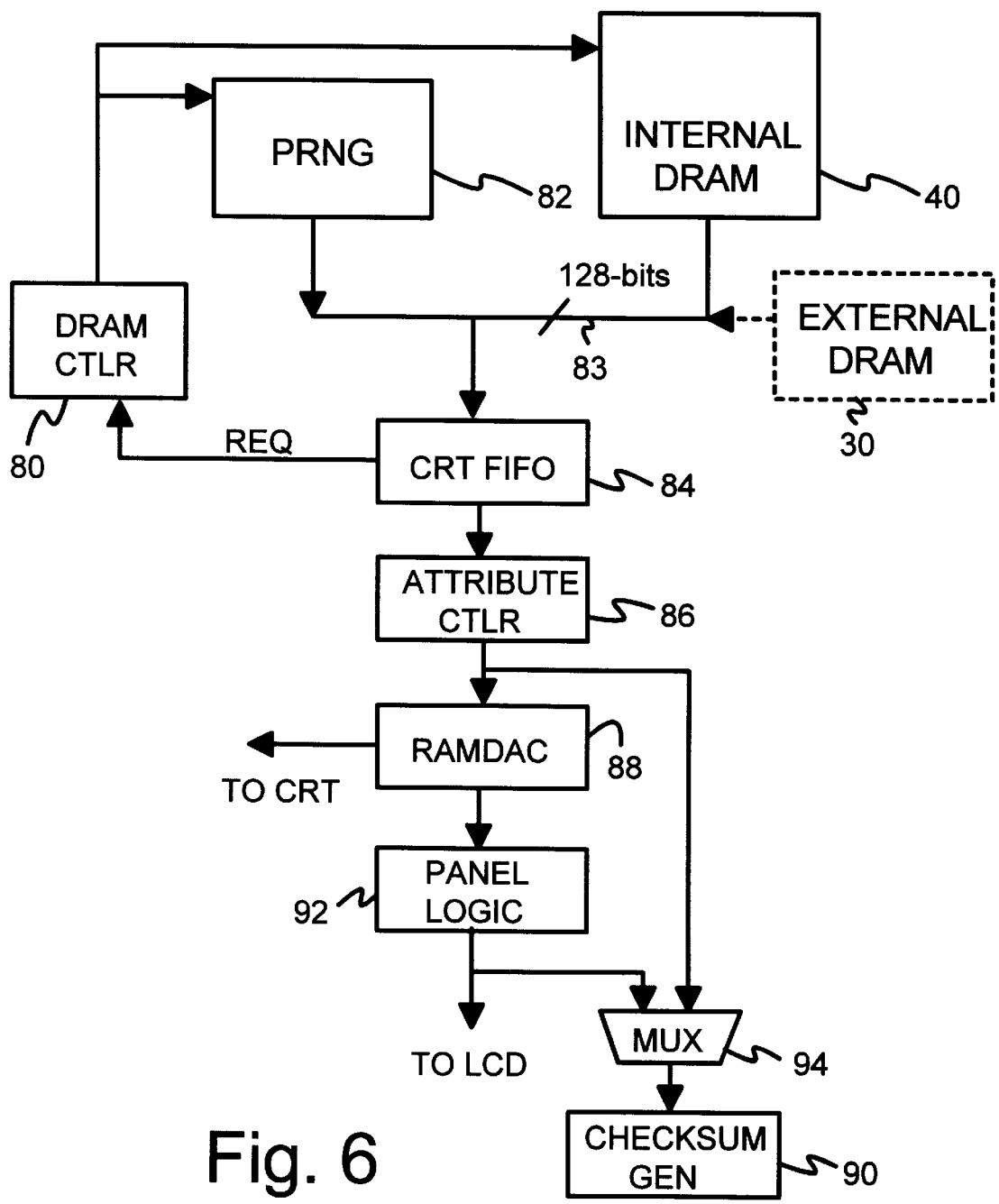
FIG. 6 shows a video controller chip with integrated DRAM and test logic.

FIG. 6 shows a video controller chip with integrated DRAM and test logic. Internal DRAM 40 is controlled by DRAM controller 80. DRAM controller 80 generates the proper timing and control signals to access data in DRAM 40. These control signals may include RAS, CAS, output-enable, and a write-enable signal. Address inputs are also provided, typically by a sequencer.

In a video controller, the video monitor or screen is continuously refreshed. A frame consists of all pixels in all horizontal lines drawn on the screen. Thus one frame is redrawn for every vertical sync period, or at the vertical refresh rate. This rate is normally 60–90 Hz. During a screen refresh, pixel data is read out of DRAM 40 and loaded into video buffer or CRT FIFO 84. CRT FIFO 84 can buffer a number of pixels, possibly even an entire horizontal line of pixels for low resolution modes and small color depths. At higher resolutions, more pixels must be transferred to the screen for each horizontal line, and CRT FIFO 84 will have to be loaded by DRAM 40 several times for each horizontal line. Higher color depths use more bits of data for each pixel, and so reduce the number of pixels that can be buffered in CRT FIFO 84. For example, 16-color depth will have 4 bits per pixel, while 256 colors require 8 bits per pixel.

CRT FIFO 84 will request another transfer of data from DRAM 40 when empty by sending a request to DRAM controller 80. The process of loading CRT FIFO 84 continues until all pixels for all horizontal lines are transferred to the screen. A vertical sync signal after the last horizontal line begins another frame of screen refresh. Each set of all horizontal lines is called a frame of data.

Attribute controller 86 receives serial pixel data transferred from CRT FIFO 84. Attribute controller 86 may modify the pixel data, perhaps by re-mapping the colors represented or blinking the pixels.

The modified pixel data is clocked out of attribute controller 86 to a RAMDAC 88. RAMDAC 88 contains a RAM that is indexed by the pixel data, and outputs digital values for red, green, and blue sub-pixels that comprise a color pixel. RAMDAC 88 also contains a digital-to-analog converter (DAC) that converts the digital color sub-pixels to analog intensity values that are transmitted to the CRT monitor. Digital pixel data from RAMDAC 88 is clocked to panel logic 92. The digital pixel data is taken from RAMDAC 88 after the RAM has been accessed and has output the digital sub-pixels, but before conversion to analog values. Panel logic 92 may perform a grayscale conversion of the color sub-pixels if an LCD screen is monochrome, or may perform some other conversion of the pixel data to a format accepted by an LCD panel. The converted pixel data from panel logic 92 is clocked into an LCD screen. The LCD screen may itself include some additional control or conversion logic to manipulate the pixel data before its is visually displayed on a screen, and it may be of many different types or technologies. When the LCD screen is of the dual-panel type, pixel data is also supplied by an indirect path from a half-frame buffer (not shown).

Mux 94 can tap off pixel data either from before the input to the RAMDAC 88, or after the panel logic 92. This allows the pixel data to be observed either before translation by the RAMDAC 88, or after. The output of panel logic 92 corresponds to the pins of the video controller chip, which may be observed by a production tester to confirm that the checksum was generated properly. The mux 94 thus allows the checksum to be generated either from the pins of the video controller chip, or from an internal location before the RAMDAC. The output of mux 94 is sent to checksum generator 90, which generates a checksum by adding the pixel data just received to a running sum. Checksum generator 90 does not have to be a full carry-save adder, but can be simply a group of single-bit adders. Many other implementations of checksum generator 90 are possible using other algorithms besides addition. For example, a shift register with exclusive-OR (XOR) gates can implement a ring counter that "sums" an input bit into the ring counter. Many other well-known checksum generators may be used.

Operation of Test Logic

The test apparatus of FIG. 6 may be operated in several ways. One preferred way is to perform a checksum over one whole frame. The vertical sync signal can then be used as a start/stop signal for the checksum generator.

During test mode, pseudo-random number generator (PRNG) 82 will be enabled and will output a seemingly random value onto memory data bus 83 for each DRAM read cycle. Requests from CRT FIFO 84 to be reloaded with pixel data are sent to DRAM controller 80. DRAM controller 80 generates DRAM control and timing signals as in normal mode, except that the DRAM write signal is inverted during test mode. Instead of DRAM 40 reading a pixel of data out onto memory data bus 83, pseudo-random number generator (PRNG) 82 outputs data onto memory data bus 83. This pseudo-random data is written into DRAM 40 since the write signal is inverted for test mode. This pseudo-random data is also sent to CRT FIFO 84, for display on a screen.

Thus pseudo-random number generator (PRNG) 82 supplies pseudo-random pixel data to k DRAM 40 and to CRT FIFO 84 during test mode. The pseudo-random data is written to DRAM 40 and also sent through the graphics data path logic of the video controller, including CRT FIFO 84 and attribute controller 86. If a monitor is not attached, as during production test, the pixel data can still be observed at the pins of the video controller chip by a tester. The checksum generator 90 also receives the pseudo-random pixel data. If the vertical sync signal is used to start and stop the checksum generator 90, then a checksum will be generated for the entire frame, all the pixels in all the horizontal line of one screen.

Once the first frame has been transferred from the pseudo-random number generator (PRNG) 82, and a checksum generated, the checksum can be read out of the video controller chip by the tester or a software test program. A register on the video controller chip can be defined to hold the current output of the checksum generator 90, and can be read just as any other video register would be read. Since the vertical sync is active for a relatively long period of time, the software can poll a status register on the video controller chip. When the status register indicates that the vertical sync signal is active, then the checksum register can be read and/or cleared by the software.

On the next frame, the pseudo-random number generator (PRNG) 82 is disabled, and the DRAM write signal is returned to indicate read. During this next frame, the pseudo-random pixel data is used that was written to DRAM 40 by pseudo-random number generator (PRNG) 82 during the first test frame. Thus pseudo-random number generator (PRNG) 82 supplies CRT FIFO 84 during the first test frame, while DRAM 40 supplies CRT FIFO 84 during the second frame. Since the data written to DRAM 40 during the first test frame is the same data read out of DRAM 40 during the second frame, an identical checksum should be generated during both the first and second frames.

Any mismatch between the first frame's checksum and the second frame's checksum would indicate an error, such as a bad DRAM memory cell. Checksums should be unique, since the number of pixels in a frame is large (640×480= 307,200 pixels added together to get the checksum).

In the preferred embodiment, the memory data bus is 128 bits wide, while the pseudo-random number generator is 16-bits in width. The 16-bits output from the PRNG is inverted and output as the second group of 16 bits, and then the original and inverted bits are scrambled or hashed in different combinations to produce the other 6 groups of 16 bits. This inverting and hashing occurs inside PRNG 82.

Testing While in a PC

Surprisingly, testing is also possible while the video controller chip is inside an end-user's PC. A production tester is not necessary. The PRNG generates the data stream, while the checksum generator combines an entire frame of pixels into a single checksum. The checksum can be read out of the video controller chip after each frame and compared to determine if an error occurred. Registers in the video controller chip must be accessible to normal graphics software to set resolution modes and map colors. It is a simple matter to defame an extra register to hold the checksum. Thus a diagnostic utility program can be easily written that an end user can run to test the video controller chip while it is installed in a PC. The screen refresh can proceed continuously, with data being supplied by the PRNG on alternate frames. Several successive tests can be performed by comparing the unique checksums generated for every pair of frames. The starting point of the pseudo-random number sequence can be varied with a "seed", or even with a simple counter, so that each pair of frames tests a different sequence of pseudo-random numbers, and therefore generates a different checksum. Well-known memory-sensitive data patterns of moving ones or moving zeros, or sliding patterns can be easily incorporated.

Ideally a high resolution and color depth mode is used to test the DRAM. Higher resolutions require a larger memory size to hold the increased number of pixels per screen or frame. Thus a larger amount of the DRAM will be tested at higher resolutions. For testing, a resolution mode and color depth may be chosen that is about equal to the size of the DRAM memory.

The testing may be used to test not only the DRAM, but also the graphics data path. Having two locations in the data path to tap into with the checksum generator allows for isolating different parts of the graphics data path. The pseudo-random number generator may be initialized with a particular starting value so that the sequence generated is deterministic. In this way an expected value or "signature" for the checksum can be checked for different video modes.

Testing DRAM Leakage

DRAM cell leakage can also be tested with the present invention. Leakage is normally tested by writing a one to a DRAM cell, waiting a period of time, and then reading the same cell without performing any intervening DRAM refresh cycles to restore the charge stored in the DRAM memory cells. The charge in the cell will decay and leak away after a period of time. This is an important parameter of the DRAM.

After the first test frame is written, further reads or writes to the DRAM are halted by shutting down the screen refresh. Once the desired period of leakage time has elapsed, screen refresh is restarted and the second frame is read. If the checksum matches the first frame's checksum, then the period of time was not long enough to cause leakage, and the DRAM can be safely refreshed at this rate. The period of time can be incremented until a checksum mismatch occurs to give an indication of the absolute leakage period, or a simple test using just one period of time can be used to determine if the DRAM meets system requirements.

Preferably a checkerboard pattern, rather than a pseudo-random pattern, is used for the leakage test. A checkerboard pattern generator (not shown) can be used instead of the PRNG. The checkerboard can be easily inverted on each read. A walking ones or zeros pattern generator can also be integrated onto the video controller chip for additional test patterns.

The present invention may be practiced with surprisingly minimal additional hardware on the video controller chip. A pseudo-random number generator and possibly a few other pattern generators can be added since the amount of die area for these functions is small. Very little additional control logic is needed, since the DRAM controller is used for timing. A checksum generator can tap into the pins of the chip, or at other internal nodes, rather than on the speed-critical internal DRAM memory bus. The checksum generator need not be complex and can also be added with a small area increase.

External DRAM may also be Tested

The testing apparatus of FIG. 6 may also be used to test the external DRAM using the video controller datapath. External DRAM 30 is also controlled by DRAM controller 80. During the test mode, PRNG 82 generates pixel data which is sent to CRT FIFO 84 and then down the video controller datapath. This pixel data from PRNG 82 is also written to external DRAM 30 over memory data bus 83. On the second frame, PRNG 82 is disabled and instead external DRAM 30 supplies the pixel data. This external pixel data is assembled and muxed onto memory data bus 83, sent to CRT FIFO 84, and then sent down the video controller datapath to eventually be supplied to checksum generator 90. If the checksum from the first frame, when PRNG 82 supplied the pixel data, does not match the checksum from the second frame, when external DRAM 30 supplies the pixel data which was written to external DRAM 30 during the first frame, then an error occurred in external DRAM 30. Internal DRAM 40 and external DRAM 30 may be tested at the same time for a large frame which has pixel data interleaved from both internal and external DRAM. Interleaving logic such as described for FIG. 3 may be used to connect internal DRAM 40 and external DRAM 30 to memory data bus 83.

DRAM Fully Tested by Dummy Resolution Mode

For certain sizes of video memory, the existing supported video resolutions may not exactly cover the entire video memory. While high resolutions can be used to cover all the video memory with some of the video memory being aliased or used twice, it is better to have the resolution exactly match the size of the video memory when testing. Although existing industry-standard resolutions may not exactly fit the video memory, a dummy resolution mode may be defined which exactly fits the video memory. The horizontal and vertical synch rates are defamed for this dummy resolution to exactly fit the size of the video memory, whether internal, external, or both combined.

ALTERNATE EMBODIMENTS

Several other embodiments are contemplated by the inventor. For example, the various blocks of the video sub-system may be integrated onto one or more silicon substrates, depending upon the technology used. The invention has been described in terms of a combined CRT and LCD controller for a portable PC, but the invention could apply to desktop computers with only CRT that are designed to be energy-efficient. The invention could also be used for LCD-only systems.

The preferred embodiment used the PCI bus, but other host busses such as VESA, EISA, or ISA (AT) may be used. Many implementations of the logic disclosed herein is possible. The video memory is preferably constructed of dynamic RAM chips, but more expensive Video RAM (VRAM) chips or other types of memory chips may be used. Modules may be used instead of chips. For external DRAM, inexpensive SIMM modules are preferred to individual DRAM chips.

Other types of pattern generators may be substituted, for example a walking ones or zeros, checkerboard, or counter pattern generator, or a combination of any of these. The test method may also be applied to a video controller with an external video memory. Although testing external DRAM or other types of external video memory is not as difficult as testing internal DRAM, the present invention would allow for diagnostic testing of the video memory by the end user. The video memory may be tested by a simple software diagnostic routine that only has to write and read registers on the video memory board. The software can perform the comparison of the checksums for two frames, or the comparison could be implemented in hardware on the video controller chip or board. Being able to test the video memory after the video controller chip has been soldered onto a video board and even after the video board has been plugged into a PC allows for diagnostic testing that is not now available. Testing the video memory on the end-user's system can reduce technical support costs. Performing a full test on the video memory builds confidence that the video subsystem is functioning properly. The pseudo-random number generator can be made to begin its sequence with a different pseudo-random number for each frame by providing a "seed" number to generate the first pseudo-random number.

Of course, the data bit stored in the DRAM cell can easily be inverted, and inverting buffers may be inserted into the data path. Indeed, the invention is particularly insensitive to these data inversions. The comparison and storing of the checksum could also be accomplished in software, reducing even further the amount of hardware required for the testability features described herein. Page-mode or burst-mode DRAMs may be used as the external or internal DRAM. The buffers 42, 44 of FIG. 3 may be expanded to several levels of depth to allow buffering of several read cycles of data, thereby improving performance to allow for slower page-miss cycles that occasionally occur.

The external DRAM video memory may be used as a half-frame buffer for a dual-scan flat panel display. For these dual-scan displays, data must be fed to the display at twice the typical rate because the screen's refresh rate is higher than a normal CRT. A half-frame buffer stores pixel data for half of the screen while the standard video logic writes to the other half, and to the half-frame buffer. When the standard video logic begins scanning the second half of the panel, the half-frame buffer sends pixels to the first half. This half-frame buffer is well-known in the art, and can be located in the external DRAM memory, or as a second external DRAM memory.

Another use of the slower external DRAM memory is to support text modes rather than bit-mapped modes. In text mode, the memory space is arranged in a more random fashion than in standard bit-mapped modes. In text mode, a representation of the character, such as its ASCII code, is fetched from the video memory. This ASCII code must then access a font memory than contains a pixel bit map for that ASCII text character. These ASCII characters are not arranged in the font memory in the same order as they are displayed on screen, for typical text documents. Thus a more random access pattern occurs for font memory. Additionally, the size of each font memory access is small, being the width in pixels of a single text character. Character fonts may only have 8 by 8, 8×14, or 8×16 pixels. Thus 32 bit-wide memory is sufficient for font memory access. In contrast, bit-mapped video memory may access up to a whole scan line of pixels, perhaps 640 to 1280 pixels, and wider 128-bit memory is more efficient. Thus the slower, narrower external memory is ideally suited for font memory, allowing the internal memory to be used for more efficient sequential access for scan lines.

The external DRAM, or a portion of it, could be used as a temporary scratch-pad memory for the video controller, especially if complex graphics operations are performed. The external memory may also be used for full-video overlay, where a video frame, such as from a television broadcast receiver, is laid over a portion of the display. Typically a portion of video memory is set aside to receive the pixel data for the video overlay frame, which is then merged into the pixel data screen as the display is scanned. This video overlay frame buffer may also be located in the external DRAM. An advantage to using external video memory for the video overlay frame buffer is that external sources such as host software may update these overlays without directly accessing the video memory controller.

While 8-bit (1 byte) pixels have been described, larger pixel sizes may also be supported. For example, a 16-bit pixel allows for 64K colors, while a 24-bit pixel supports 16 Million colors, known as true-color resolution. The data paths disclosed herein can simply be expanded for the wider pixels.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A testable graphics controller chip comprising:

an internal video memory on the graphics controller chip for storing pixels for display on a screen;

a graphics data path, coupled to receive pixels from the internal video memory, the graphics data path manipulating pixels for display on the screen;

a pseudo-random-number generator, coupled to the internal video memory and to the graphics data path, for generating a sequence of pseudo-random pixel values;

a video memory controller, coupled to the internal video memory and coupled to the pseudo-random-number generator, for controlling reading of pixels from the internal video memory to the graphics data path during a normal display mode;

test means, coupled to the pseudo-random-number generator and the video memory controller, for writing the pseudo-random pixel values from the pseudo-random-number generator to both the internal video memory and to the graphics data path during a test mode;

wherein the internal video memory is written by the pseudo-random-number generator rather than read during the test mode, the pseudo-random-number generator simultaneously supplying pixel values to both the internal video memory and to the graphics data path;

a checksum generator, coupled to receive pixels manipulated by the graphics data path, the checksum generator generating a condensed checksum of pixels outputted from the graphics data path;

alternate frame means, coupled to the checksum generator and to the test means, for storing a first checksum from the checksum generator during a first frame of pixels when the pseudo-random-number generator writes pixel values to the internal video memory, the first checksum being a condensed checksum of the pseudo-random pixel values from the pseudo-random-number generator after manipulation by the graphics data path;

compare means, receiving the first checksum, for signaling an error when the first checksum does not match a second checksum, the second checksum generated by the checksum generator during a second frame of pixels when the internal video memory writes pixels to the graphics data path and the pseudo-random-number generator is disabled, the second checksum being a condensed checksum of the pseudo-random pixel values written by the pseudo-random-number generator into the internal video memory during the first frame and read out during the second frame, whereby the graphics controller chip tests both the internal video memory and the graphics data path simultaneously using pixel values generated by the pseudo-random-number generator and whereby the first checksum of pixel values from the pseudo-random-number generator during the first frame is compared to the second checksum of pixels stored in the internal video memory during the second frame.

2. The testable graphics controller of claim 1 wherein the graphics data path comprises:

a video FIFO buffer for buffering pixels read from the internal video memory or from the pseudo-random-number generator;

an attribute controller, receiving buffered pixels from the video FIFO buffer, for manipulating the buffered pixels to add attributes;

a RAMDAC, coupled to the attribute controller, for re-mapping pixel colors, the RAMDAC outputting digital pixels to the checksum generator and converting the digital pixels to analog voltages for driving an external display screen.

3. The testable graphics controller of claim 2 further comprising:

a flat-panel converter, coupled to receive re-mapped pixels from the RAMDAC, for converting pixels to a format for display by a flat-panel display.

4. The testable graphics controller of claim 1 further comprising:

an interface to an external video memory, for storing pixel values from the pseudo-random-number generator in the external video memory during the first frame of the test mode, the interface reading pixels from the external video memory during the second frame and during the normal display mode.

5. The testable graphics controller of claim 1 wherein the internal video memory is tested by the pseudo-random pixel values from pseudo-random-number generator and not by external pixel values from an external tester, whereby the internal video memory is self-tested.

* * * * *